United States Patent [19]

Watanabe et al.

[11] Patent Number: 4,629,996
[45] Date of Patent: Dec. 16, 1986

[54] FEED-FORWARD MICROWAVE POWER AMPLIFIER WITH DIFFERENCE SIGNAL DISTORTION CANCELLATION CIRCUIT

[75] Inventors: Tatsuo Watanabe, Tokyo; Kiyohiko Suzuki, Kanagawa, both of Japan

[73] Assignee: Kokusai Denshin Denwa Co., Ltd., Tokyo, Japan

[21] Appl. No.: 671,849

[22] Filed: Nov. 15, 1984

[30] Foreign Application Priority Data

Nov. 15, 1983 [JP] Japan .................................. 58-213299

[51] Int. Cl.$^4$ ............................................. H03F 1/26
[52] U.S. Cl. .................................. 330/151; 330/124 R; 330/149; 330/29 S
[58] Field of Search ..................... 330/124 R, 149, 151, 330/295

[56] References Cited

U.S. PATENT DOCUMENTS

| | | | |
|---|---|---|---|
| 3,471,798 | 10/1969 | Seidel .................................... | 330/151 |
| 3,993,961 | 11/1976 | Narayanan ........................ | 330/151 X |
| 4,130,807 | 12/1978 | Hall et al. .......................... | 330/151 X |
| 4,258,328 | 3/1981 | Prevot et al. .................... | 330/151 X |

OTHER PUBLICATIONS

P. B. Bakken, "Feedforward Linearized with Two TWT's" NTC (National Telecommunication Conference), 1974, (IEEE publication 74CHO902-7 CSCB, pp. 953–958.

Primary Examiner—Eugene R. LaRoche
Assistant Examiner—Steven J. Mottola

[57] ABSTRACT

A feed forward microwave power amplifier having a divider for dividing an input signal into two parts, a first main amplifier for amplifying one of the divided signals, means for providing a part of the output of the first amplifier as a signal $S_1$, means for providing a signal $S_2$ by another output of the divider, a subtractor for providing the difference between $S_2$ and $S_1$, a second amplifier having the same gain as that of the first amplifier for amplifying this difference, a 3 dB coupler for coupling an output $S_4$ of the first amplifier and an output $S_4e$, where e is a constant, of the second amplifier to provide coupled power which is free from distortion, and adjusting means for adjusting the level of signals $S_1$ and $S_2$ so that $S_2$ is higher than $S_1$, and the value e is in the range between 0.2 and 0.5. The particular features of the present invention, compared with a prior feed forward amplifier, are the use of a 3 dB coupler, and the configuration of the second amplifier which accepts not only the distortion component but also some desired component of the output of the first amplifier.

5 Claims, 9 Drawing Figures

Fig. 1a  PRIOR ART
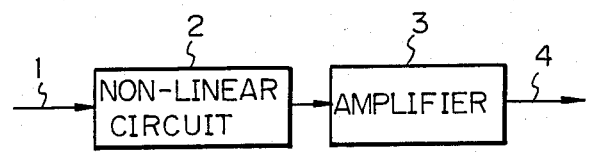
Fig. 1b PRIOR ART          Fig. 1c PRIOR ART
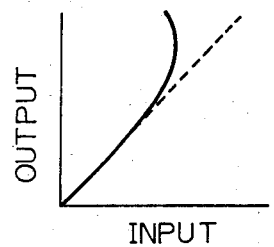 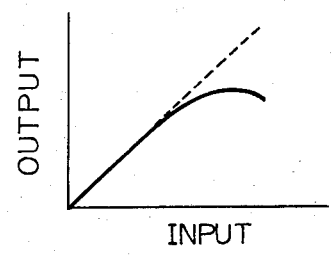
Fig. 2  PRIOR ART
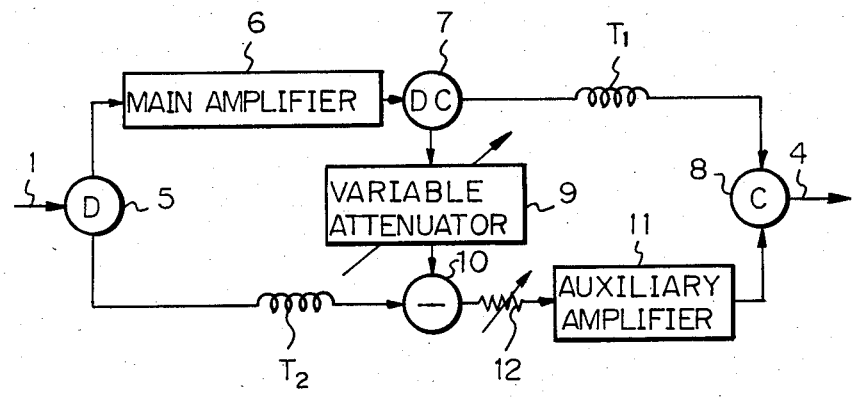

FEED-FORWARD MICROWAVE POWER AMPLIFIER WITH DIFFERENCE SIGNAL DISTORTION CANCELLATION CIRCUIT

BACKGROUND OF THE INVENTION

The present invention relates to a microwave power amplifier, and in particular, relates to a high power transmitter for a satellite communication system.

A transmitter in an earth station for a satellite communication system is required to have high transmitting power, and therefore, the design of a transmitter is an important consideration in constructing an earth station. When a number of signals are transmitted by a single power amplifier, an undesirable intermodulaton occurs due to the non-linear characteristics of the power amplifier which operates close to the saturation output power level, and so, the ratio of the desired signal power to the undersired power is decreased. Further, said intermodulation deteriorates the quality of the reception signal. Accordingly, a large transmitter which is able to provide output power several times as large as the required output power has been used in a conventional earth station so that an undesired intermodulation does not occur.

A prior system for overcoming said intermodulation at the operation level close to the saturation level of a transmitter is a pre-distortion system as shown in FIG. 1, in which numeral 1 is an input signal, 2 is a non-linear circuit, 3 is a power amplifier which is subject to compensation, and 4 is an output signal. It is assumed that the power amplifier 3 has the characteristics as shown in FIG. 1C in which the horizontal axis shows an input power, and the vertical axis shows an output power, the dotted line is the ideal linear characteristics, and the solid line is the actual characteristics. In that case, the non-linear circuit having the inverse characteristics as shown in FIG. 1B, in which the horizontal axis shows an input power, the vertical axis shows an output power, the dotted line shows the linear characteristics, and the solid line shows the characteristics of the non-linear circuit 2, is used. The characteristics of the non-linear circuit 2 is designed so that the combination of the non-linear circuit 2 and the amplifier 3 provides the linear characteristics. The non-linear circuit 2 is constituted by using a diode, or an amplifier as a non-linear element.

Another prior art for compensation of intermodulaton is a high power transmitter is a feed forward amplifier system as shown in FIG. 2, in which the numberal 1 is an input signal, 5 is a divider, 6 is a power amplifier, 7 is a directional coupler, 8 is a combiner, 9 is a variable attenuators, 10 is a subtrarctor, 11 is an auxiliary amplifier, $T_1$ and $T_2$ are delay circuits which include phase shifters.

In FIG. 2, the input signal is divided into two parts, one of which is applied to the main amplifier 6. Then, almost all the portion of the output of the amplifier 6 is applied to the combiner 8 through the delay circuit $T_1$, and some small portion of the output of the amplifier 6 is separated and is applied to the subtractor 10 through the variable attenuator 9. The subtractor 10 also receives the divided input signal through the delay circuit $T_2$. The delay circuits $T_1$ and $T_2$ function to compensate the delay time in the amplifiers 6 and 11, respectively, so that the subtractor 10 and the combiner 8 can receive a pair of inverse-phased signals, and a pair of inphase signals, respectively.

When the input signal level 1 is low and the main amplifier 6 operates at the linear region, no distortion is generated by the amplifier 6. It is supposed that the variable attenuator 9 is adjusted so that the subtractor 10 does not provide an output power when said amplifier 6 does not generate distortion. Then, the output of the subtractor 10 is only the distortion component which is generated by the main amplifier 6 when the input signal 1 is at a high level. The distortion component at the output of the subtractor 10 is amplified by the auxiliary amplifier 11, which provides the amplified distortion component to the combiner 8. The combiner combines the signal which has the distortion from the delay circuit $T_1$, and the distortion component from the axuiliary amplifier 11, then, the distortions in both the inputs of the combiner 8 are cancelled with each other, and the combiner 8 provides the output signal 4 which is free from distortion.

Although the feed forward system as described in accordance with FIG. 2 has the advantage that the distortion is compensated considerably, the prior feed forward system has the disadvantage that the auxiliary amplifier 11 must have a large power capacity, even equal to that of the main amplifier 6, in order to compensate for the large distortion component. Further, the combiner or coupler 8 is usually a 6 dB coupler, and therefore, the output power of the auxiliary amplifier 11 does not fully contribute to the combined output power 4, and the efficiency of the total system is decreased.

The prior feed forward system has still a further disadvantage that a trouble of a main amplifier makes the system transmitting power one fourth, and if the auxiliary amplifier output power is the same as that of the main amplifier, the system operation becomes too difficult to maintain the communication link.

SUMMARY OF THE INVENTION

It is an object, therefore, of the present invention to overcome the disadvantages and limitations of a prior high power transmitter by providing a new and improved power amplifier.

It is also an object of the present invention to provide a power amplifier which provides not only the improvement of the distortion characteristics but also the efficiency of the amplifier.

Still another object of the present invention is to provide a transmitter which operates even when there is some trouble with a main amplifier.

The above and other objects are attained by a power amplifier as shown in FIG. 3, comprising an input terminal, a divider for dividing an input signal at said input terminal to a pair of signals with equal level S with each other, a first amplifier for amplifying one of said divided signals, means for providing a signal $S_1$ which is a part the of output of said first amplifier, means for providing a signal $S_2$ by another output of said divider, a subtraction means for providing the difference between $S_2$ and $S_1$, a second amplifier have the same gain as that of the first amplifier for amplifying said difference, a 3 dB coupler for coupling an output $S_4$ of said first amplifier and an output $S_{4e}$ of said second amplifier and for providing coupled power to an output terminal, where e is constant, and adjusting means for adjusting said level $S_1$ and said level $S_2$ so that level $S_2$ is higher than level $S_1$, and said value e is in the range between 0.2 and 0.5.

BRIEF DESCRIPTION OF THE DRAWINGS

The foregoing and other objects, features, and attendant advantages of the present invention will be appreciated as the same become better understood by means of the following description and accompanying drawings wherein;

FIGS. 1A, 1B and 1C show a prior pre-distortion system,

FIG. 2 is a block diagram of a prior feed forward system,

DESCRIPTION OF THE PREFERRED EMBODIMENTS

Figure 3A:
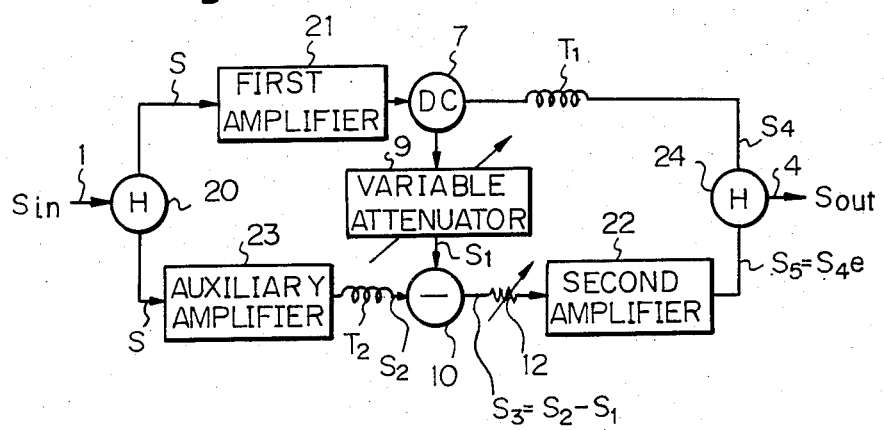
FIG. 3(a) and FIG. 3(b) are block diagrams of the transmitter according to the present invention.

FIG. 3 shows a block diagram of the transmitter according to the present invention. In the figure, the numerals 20 and 24 designate 3 dB couplers, 21 designates a first amplifier A which is subject to compensation, 22 designates a second amplifier B which is able to provide the same output power as that of the amplifier A 21 and which has the same gain as that of the first amplifier A. The numeral 23 designates an auxiliary amplifier which can provide low output power. Other numerals and symbols in FIG. 3 show the same members as those in FIGS. 1 and 2.

The input signal ($S_{in}$) 1 is applied to the 3 dB coupler 20 which divides the input signal into two signals S. One of the divided signals is applied to the main amplifier (first amplifier) 21, the ouput of which is applied to the 3 dB coupler 24 through the directional coupler 7 and the delay circuit $T_1$. The other divided signal is applied to the auxiliary amplifier 23, which provides the output signal $S_2$ to the subtractor 10 through the delay circuit $T_2$. Said subtractor also receives the signal $S_1$ which is a part of the output of the main amplifier 21, divided by the directional coupler 7 which provides said signal $S_1$ through the variable attenuator 9. The signal $S_1$ in voltage indication is shown as follows.

$$S_1 = \left[ \frac{S}{\sqrt{2}} G_{1(s)} + d_{(s)} \right] /LA \qquad (1)$$

where S=level of each output of the divider 20,
L=attenuation coupling loss of the directional coupler 7,
$G_{1(s)}$=voltage gain of the amplifier A 21,
A=attenuation of the variable attenuator 9, and
$d_{(s)}$=distortion output of the amplifier A 21.

Among them, $G_{1(s)}$ and $d_{(s)}$ depend upon the level S of the input signal to the amplifier 21, and when the level of the input signal S is high enough to enter the non-linear operational region of the amplifier 21, the gain $G_1$ decreases, and the distortion output d increases.

Figure 4:
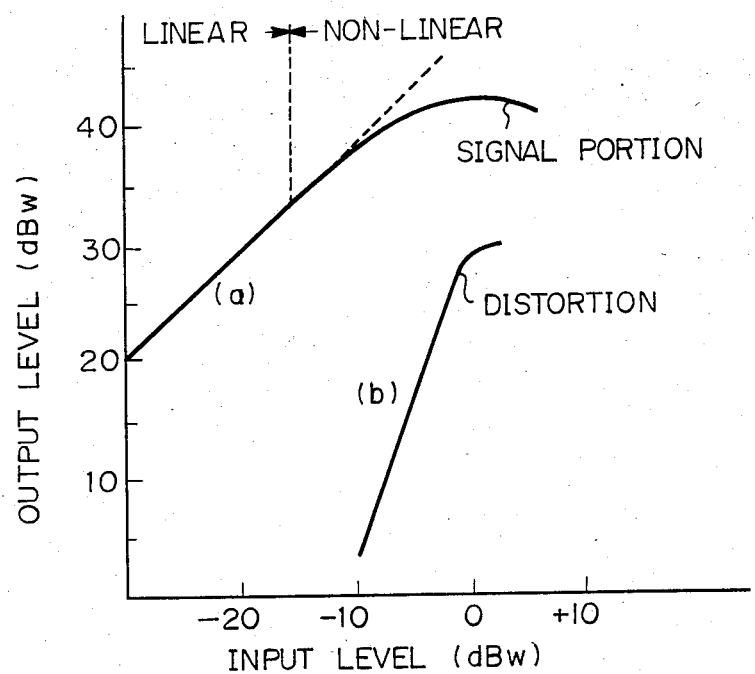
FIG. 4 shows the characteristics of the amplifier 21 in FIG. 3.

FIG. 4 shows an example of the input level vs-output level characteristic (a), and the distortion output (b) for each input signal level.

On the other hand, the output signal $S_2$ from the delay circuit $T_2$ is expressed as follows, where $G_3$ is the voltage gain of the auxiliary amplifier 23.

$$S_2 = \frac{S}{\sqrt{2}} G_3 \qquad (2)$$

Accordingly, the output signal $S_3$ of the subtractor 10 is expressed as follows.

$$S_3 = \frac{S}{\sqrt{2}} G_3 - \left[ \frac{S}{\sqrt{2}} G_{1(s)} + d_{(s)} \right] /LA \qquad (3)$$

$$= \frac{S}{\sqrt{2}} \left[ G_3 - \frac{G_{1(s)}}{LA} \right] - d_{(s)}/LA \qquad (4)$$

$$= \frac{S}{\sqrt{2}} e - d_{(s)}/LA$$

$$e = G_3 - G_{1(s)}/LA$$

It should be appreciated that in a linear operation region in FIG. 4 the distortion output $d_{(s)}$ is nearly zero, or very small, and the gain $G_{1(s)}$ is constant. Accordingly, the second term of the equation (4) can be neglected, and the value e of the equation (4) is constant.

It should be noted that the prior art shown in FIG. 2 designs the values L and A so that the value e is zero, where the second amplifier amplifies only the distortion component.

On the other hand, it is the basic concept of the present invention that the value of the expression within the [ ] brackets in equation (4) or the value e is selected not to be zero, but is preferably selected to be in the range between 0.2 and 0.5. Preferably, the value $G_{1(s)}/LA$ is selected to be 1.0, and the value $G_3$ is selected to be in the range between 1.2 and 1.5.

With the above value selection, the subtractor 10 provides the difference signal $S_3$ which is inphase with the output of the main amplifier 21 for the desired signal, and is in opposite phase for the undesired distortion component, and which has an amplitude in the range between 0.2 and 0.5 of the output of that amplifier 21. Said difference signal $S_3$ is amplified by the second main amplifier B 22, the output of which is combined with the output of the first main amplifier 21 in the 3 dB coupler 24. It should be appreciated that the second amplifier 22 is similar to the amplifier 21, and has nearly the same gain and the same output power as those of the amplifier 21.

Next, the 3 dB coupler 24 is described.

Figure 5:
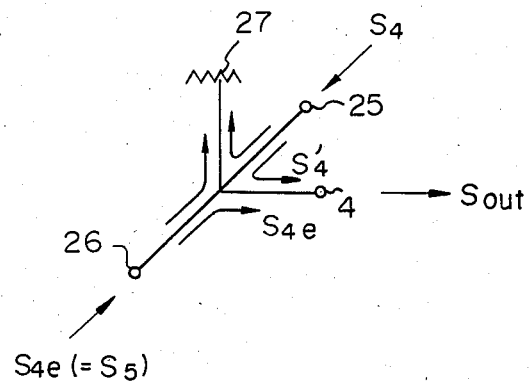
FIG. 5 shows a magic T device.

FIG. 5 shows a magic T coupler as an exampled of a 3 dB coupler. In FIG. 5, the numeral 25 and 26 designate input ports, 4 designates an output port, and 27 designates a dummy port which is coupled with a dummy resistor. The signal $S_4$ at the output of the delay circuit $T_1$ is applied to the port 25, and the signal $S_5$ (=$S_4$e), which is the output of the second main amplifier 22, is applied to the port 26. Those two input signals $S_4$ and $S_5$ are coupled with each other, and the combined signal is applied to the output port 4 and the dummy port 27.

It is assumed that the value of the expression within the brackets [ ] of equation (4) is expressed by (e); then, the signal $S_5$ is expressed as follows.

$$S_5 = S_4 e \qquad (5)$$

The output signal at the output port 4 of the magic T for the inphase coupling and the opposite phase coupling is expressed as follows, respectively.

$$S_{out}(\text{inphase}) = \frac{S_4}{\sqrt{2}} + \frac{S_4 e}{\sqrt{2}} = \frac{S_4}{\sqrt{2}}(1+e) \tag{6}$$

$$S_{out}(\text{opposite phase}) = \frac{S_4}{\sqrt{2}} - \frac{S_4 e}{\sqrt{2}} = \frac{S_4}{\sqrt{2}}(1-e) \tag{7}$$

The coupling loss $\phi$ in case of inphase combination is as follows.

$$\phi(\text{inphase}) = \frac{(\text{output power})}{(\text{input power})} = \frac{\left[\frac{S_4}{\sqrt{2}}(1-e)\right]^2}{S_4^2 + S_4^2 e^2} \tag{8}$$

$$= (\tfrac{1}{2})(1+e)^2/(1+e^2)$$

Similarly, the coupling loss in case of opposite phase is shown below.

$$\phi(\text{opposite phase}) = (\tfrac{1}{2})(1-e)^2/(1+e^2) \tag{9}$$

When it is assumed that the value e is e=0.4 when the amplifier 21 operates in the linear operation region, the power loss in the coupler 24 is only 0.7 dB as shown in the above equation (8). Therefore, it should be appreciated that the output power of the amplifiers 21 and 22 is transmitted with high efficiency.

When the level of the input signal S increases and whem the amplifier 21 operates in the non-linear region in FIG. 4, the gain of the amplifier decreases as shown by the curve (a), and the distortion increases as shown by the curve (b). In that case, the value (e) increases as the gain of the amplifier 21 decreases. Accordingly, the value (e) in the equation (8) increased, and therefore, the coupling loss at 3 dB coupler 24 decreases less and less.

On the other hand, it should be noted that the distortion in the signal $S_3$ which is the output of the subtractor 10 is in opposite phase with that of the main signal S since the level $S_2$ is higher than the level $S_1$, and the level of that distortion is $d_{(s)}/LA$. That distortion component is applied to the second main amplifier 22 which has the gain $G_2$ (=$G_1$=LA), and provides the distortion output with the level $d_{(s)}$. Accordingly, the distortion $d_{(s)}$ by the first amplifier 21 at the input of the coupler 24 is cancelled completely. In other words, the distortion in the signal $S_4$ is cancelled by the distortion in the signal $S_5$, since the phase of the distortion in the signal $S_4$ is opposite to that of the distortion in the signal $S_5$, while the desired signals $S_4$ and $S_5$ are combined inphase.

As described above, according to the present invention, the distortion of the amplifiers 21 is cancelled, and the output power of signals from both amplifiers is transferred to an external circuit with only a small loss.

The variable attenuators 9 and 12 are adjusted so that the level of the distortion in the signal $S_4$ is the same as the distortion in the signal $S_5$ at the input ports of the 3 dB coupler 24. The condition is satisfied when the value e is in the range between 0.2 and 0.5.

The present invention has the further advantage that the amplifiers 21 and 22 function as active emergency apparatuses to each other. In other words, even when there is trouble in one of the amplifiers 21 and 22, communication can continue. When there is trouble with the first amplifier 21, the value of the expression in the brackets [ ] in equation (4) or the value e becomes 1.4, although that value when there is no trouble is e=0.4. Then, the level of the signal $S_1$ which is the output of the variable attenuator 9 becomes zero. The signal $S_2$ is attenuated by $1/\sqrt{2}$ by the 3 dB coupler 24 when the level of the signal $S_1$ is zero. Accordingly, the total loss in case of trouble in the amplifier 21 is $1.4 \times (1/\sqrt{2})=1$. Accordingly, the signal $S_5$ at the input of the coupler 24 does not decrease, although the level of the other signal $S_4$ at another input port of the coupler 24 is zero. The total loss in case of trouble in the amplifier 21 is only 3 dB. Similarly, when the second amplifier 22 is in trouble, the level of the output signal $S_{out}$ of the coupler 24 is attenuated by 3.6 dB as compared with that of the condition of e=0.4.

Accordingly, it should be appreciated that the present transmitter still operates with the loss of 0 dB or 3.6 dB, even when there is some trouble with one of the amplifiers 21 and 22.

Figure 3B:
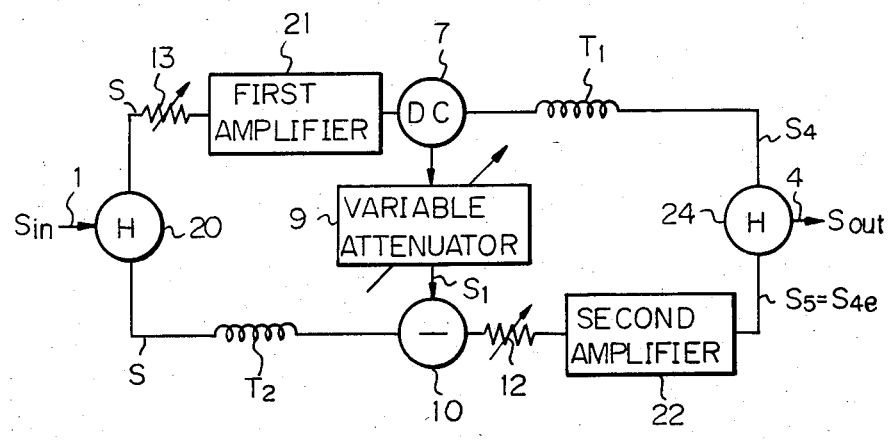

In some modification, the auxiliary amplifier 23 which functions to provide the value e=0.2 through 0.5 can be omitted by inserting an attenuator at either an input or an output of the amplifier 21. When that attenuator provides 3 dB of attenuation, the value (e) is adjusted to be 0.3. In another modification as shown in FIG. 3(b), the auxiliary amplifier 23 is omitted by replacing the divider 20 by the particular directional coupler which provides a pair of outputs with the output ratio 1:1.4 (in case of e=0.4).

In should be appreciated that it is preferable that the frequency characteristics and the phase characteristics of the paths (20-21-7-24) and (20-23-10-22-24) are the same as each other. Accordingly, an amplitude equalizer, and/or a phase equalizer may be inserted in one of or both of said paths.

When the level of the input signal S increases further, the second main amplifier 22 itself operates in the non-linear region, and generates the distortion. In that case, the improvement of the distortion by the second amplifier 22 is not expected.

Figure 6:
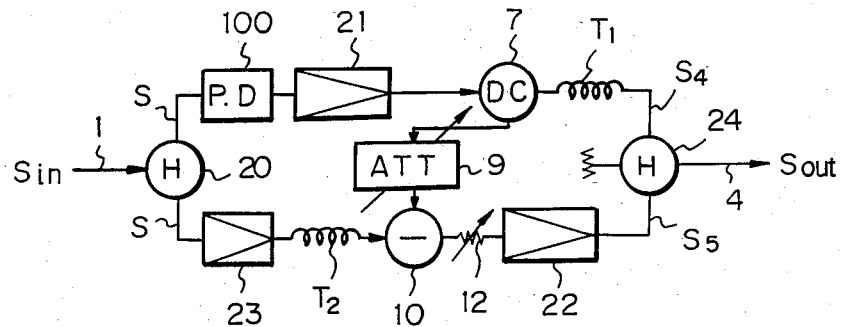
FIG. 6 is another block diagram of the transmitter according to the present invention.

FIG. 6 shows a block diagram of another embodiment of the present invention. The feature of the embodiment of FIG. 6 is the presence of the pre-distortion circuit 100 at the input of the first main amplifier 21. The operation of the pre-distortion circuit 100 is the same as the prior pre-distortion circuit as described in accordance with FIG. 1, and due to the presence of the pre-distortion circuit 100, the distortion at the output of the amplifier 21 decreases. Therefore, the output of the subtractor 10 decreases at the operational point close to the saturation level of the amplifier as compared with that of FIG. 3. Accordingly the second amplifier 22 operates linearly even at the operational point close to the saturation level of the amplifier 21, and therefore, the improvement of the distortion is increased as compared with that of FIG. 3.

As described above in detail, according to the present invention, not only the distortion characteristics but also the efficiency of the power amplifier are improved as compared with a prior feed forward transmitter system. Further, the present power amplifier does not break communication even when one of the amplifiers is in trouble, thus, the power amplifier with the high operational reliability is obtained.

From the foregoing, it will now be apparent that a new and improved microwave power amplifier has been found. It should be understood of course that the embodiments disclosed are merely illustrative and are not intended to limit the scope of the invention. Reference should be made to the appended claims, therefore, rather than the specifications as indicating the scope of the invention.

What is claimed is:

1. A feed-forward microwave power amplifier with difference signal distortion cancellation circuit, comprising:
    an input terminal;
    an output terminal;
    divider means in operable connection with said input terminal for dividing a signal input at said input terminal into a pair of divided signals with equal level S with each other;
    first amplifier means in operable connection with said divider means for amplifying one of said divided signals and providing an output signal having a level $S_4$;
    means in operable connection with said first amplifier means for providing a signal having a level $S_1$ which is a part of an output of said first amplifier means;
    means in operable connection with said divider means for providing a signal having a level $S_2$ from the other of said divided signals output from said divider means;
    subtraction means for providing a difference signal corresponding to the difference between levels $S_2$ and $S_1$;
    second amplifier means in operable connection with said subtraction means and having the same power capacity as that of said first amplifier means, for amplifying said difference signal and outputting a signal having a level of $S_4e$, where e is a constant value during small signal operation;
    3 dB coupler means in operable connection with said first amplifier means and said second amplifier means for coupling said output signal having said level $S_4$ from said first amplifier means and said output signal having said level $S_4e$ from said second amplifier means and providing a coupled power output signal to said output terminal; and
    adjusting means for adjusting said level $S_1$ and said level $S_2$ so that said level $S_2$ is higher than said level $S_1$ and said value e is in the range between 0.2 and 0.5.

2. A microwave power amplifier according to claim 1, wherein a pre-distortion circuit is provided at an input of said first amplifier means for compensating for distortion in said first amplifier means.

3. A microwave power amplifier according to claim 1, wherein said adjusting means comprises a directional coupler and an attenuator for providing said signal having said level $S_1$ from an output of said first amplifier means, and an auxiliary amplifier means for providing said signal having said level $S_2$ from an output of said divider means.

4. A microwave power amplifier according to claim 1, wherein said adjusting means comprises a directional coupler and an attenuator provided at an output of said first amplifier means, and another attenuator coupled with said second amplifier means.

5. A microwave power amplifier according to claim 1, wherein a delay circuit including a phase shifter is provided in a signal path to an input port of said 3 dB coupler means so that a pair of signals at input ports of said 3 dB coupler are in an inphase condition for desired signals, and in an opposite phase condition for distortion signal components.

* * * * *